March 21, 1967 O. C. JOACHIM 3,310,710

ELECTRICAL CIRCUIT PACKAGING ASSEMBLY

Filed April 13, 1965 2 Sheets-Sheet 1

INVENTOR
ORDEAN C. JOACHIM

BY Joseph A. Speldrich
AGENT

March 21, 1967 O. C. JOACHIM 3,310,710

ELECTRICAL CIRCUIT PACKAGING ASSEMBLY

Filed April 13, 1965 2 Sheets-Sheet 2

INVENTOR
ORDEAN C. JOACHIM

BY Joseph A. Speldrick
AGENT

United States Patent Office 3,310,710

Patented Mar. 21, 1967

3,310,710

ELECTRICAL CIRCUIT PACKAGING ASSEMBLY

Ordean C. Joachim, Minneapolis, Minn., assignor to Sperry Rand Corporation, New York, N.Y., a corporation of Delaware Filed Apr. 13, 1965, Ser. No. 447,690
15 Claims. (Cl. 317—100)

This invention relates to electronic packaging assemblies and in particular to packaging assemblies of the modular type.

The invention in essence is directed to an electronic equipment packaging scheme utilizing receptacle members adapted to engage respectively various sides of printed circuit or logic cards. Such members, in accordance with the present invention, are a printed circuit card spacer means and a card guide means cooperating with respective edges of the printed circuit card. The assembly of the present invention is directed to the features of the improved design for the printed circuit card spacer and card guide means, both cooperating with a printed circuit card.

Wtih the advent of electronic apparatus and systems of increasing complexity, it is most desirable to provide appropriate packaging techniques for electrical components and circuitry incorporated in such apparatus and systems. It is also a requirement that mountings support the circuitry components in such manner that the space requirements are reduced to the minimum. It is also expeditious that the mountings be removable units to facilitate maintenance or replacement purposes. In the modern concept of electronic apparatus, same consists generally of a plurality of removable modules or units. The modular concept, facilitates insertion and removal operations of the mounting structures as respects the electronic apparatus therewith associated. As a result of maintenance or changeover requirements, entire modules may be removed and replaced as required. Such facility of maintenance and servicing has significant cost reduction effects in terms of down time of the system.

It is customary that the logic or printed circuit cards utilized in today's electronic digital computers, for example, be plugged into appropriate receptacles to facilitate maintenance and replacement operations. The improved packaging scheme of the present invention is ideally suited for use in such digital computers, and the like.

Several factors must be considered in the fabrication of an electrical connecting means suitable for use with printed circuits. Modern complex electronic equipment requires construction permitting ease of assembly and maintenance. Additionally, modern manufacturing schemes stress automation to effect reduced costs and increased reliability. It is therefore desirable to provide a printed circuit receiving means possessing the qualities of simplified and low cost construction, reliability, and compactness.

Specifically, the present invention includes a card guide means in the form of a grid-like pattern. The supporting areas of the grid contain a groove or slot adapted to accommodate the edge of a printed circuit card in a sliding engaging and holding manner. An adjacently disposed edge of the printed circuit card containing terminating conductive terminals or test point areas is adapted to cooperate with another aspect of the invention, a card spacer or handle means containing therein a groove adapted to receive the card edge containing the contact test terminals. The spacer is adapted to cooperate with the printed circuit card so as to enable an operator to remove said entire printed circuit card and spacer assembly for maintenance or other purposes.

Accordingly, it is a primary object of the present invention to provide a more economical and improved design for a printed circuit card spacing and guiding assembly.

Another primary object of the present invention is to provide a simply constructed, easily assembled, low cost, and reliable printed circuit packaging assembly.

Another important object of the present invention is to provide an improved design for a printed circuit card guide means for use in printed circuit card packages.

Another important object of the present invention is to provide an improved design for a printed circuit card spacer means for use in printed circuit card packages.

It is another object of the present invention to provide a printed circuit card spacer means to provide the functions of an air seal, test point access area, card spacer, and stiffener for use in electronic equipment.

A yet further object of the present invention is to provide a printed circuit card guide means for use with printed circuit card packages containing open portions permitting free flow of a cooling medium through a plurality of printed circuit cards in the package.

A still further object of the present invention is to provide printed circuit card guide means accommodating a plurality of slots for receiving printed circuit card means.

These and other more detailed objects of the present invention will be more evident by reference to the specification and drawings in which.

Figure 1:
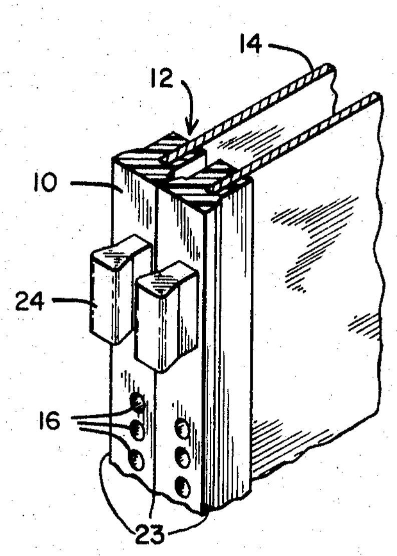
FIGURE 1 is a perspective view of the present invention illustrating printed circuit card and spacer means cooperating therewith.

Referring now to FIGURE 1, there is shown a printed circuit card handle or spacer member 10, which member contains a longitudinally extending slot 12 adapted to receive an edge of a printed circuit card 14.

Figure 2:
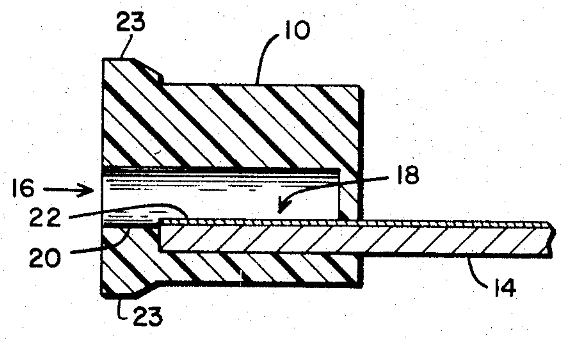
FIGURE 2 is a cross sectional end view of the spacer means of FIGURE 1.

In FIGURES 1 and 2, there can be seen extending from an opposite side of the card spacer means 10, a series of test aperture 16 having an open area 18 along an internal portion thereof. Portion 18 of the individual apertures 16 open with or communicate with the longitudinally extending cavity 12 to permit exposition of the aperture areas 16 with the slot 12 as hereinafter explained. A ledge portion 20 of each test aperture 16 extends below portion 18 as seen in FIGURE 2 to permit contact between a test probe and terminal means 22 on the printed circuit card 14.

In FIGURE 2, the printed circuit card 14 containing conductor circuitry formed thereon by methods conventionally known in the art, is inserted in the cavity 12 such that the printed circuit terminals 22 of the conductors are disposed within the cavity 12 and are exposed to aperture 16 through the open portions 18 of the individual apertures 16.

In the computer cabinet, a plurality of printed circuit cards are grouped together. As a result of the vast numbers of such cards disposed near each other, heat build-up occurs during operation of the electronic equipment which necessitates a circulation of a cooling medium such as air for example, throughout the cabinet and throughout the area in which the printed circuit cards are located.

Instances occur in which a particular circuit or circuits require checking for a determination as to their electrical characteristics. To accommodate circuit checking in the prior art, the rear of the cabinets containing the printed circuit cards were removed. As a result of the conventional arrangement of the cards, wherein same are not fitted with a spacer member, opening of the cabinet doors automatically causes loss of the cooling medium being circulated. As a result, hot spots develop in certain areas of the printed circuit cards which potentially jeopardize the functionability and life of the printed circuits. This disadvantageous result is further salient in the conventional arrangement since the testing procedure for a printed circuit card requires complete removal of the same from cabinet. The present invention in this respect is designed to overcome the above mentioned disadvantages by use of the printed circuit card handle or spacer means.

Referring to FIGURE 1, there are illustrated a plurality of printed circuit cards 14 and spacers 10 in an assembled condition. As can be observed, the spacers 10 abut along their sides 23 with each other to seal off the area behind them in which the printed circuit cards are disposed in spaced relationship by a card guide means as will be explained hereinafter.

Utilization of the card handle or spacer means has further particular advantages as part of the present invention in providing a number of additional and equally important functions. The spacers function, as is evident from the preceding description, as a seal means to prevent escape of the printed circuit card cooling medium when the cabinet doors are open. In referring to the figures of the drawing, the printed contacts or terminals 22 on the printed circuit cards provide low cost test points since the spacer means permits accommodation of a test probe within the aperture 16. The probe (which forms no part of the present invention) is positioned automatically by the spacer aperture 16 so as to dispose the probe end directly in contact with the test point terminals of the printed circuit card. Test operations can then be effected without the necessity of removing the entire printed circuit card from the cabinet and where the card is retained within the cabinet and tests effected, the cooling medium is prevented from escaping. Another intended function of the handle or spacer means is the spacing of side by side cards, and, because the cards on one side fit into the spacer groove and on the other side fit into a groove of the card guide means to be explained, the spacer effects a more rigid mounting and positional stability of the card. This in turn may prevent shorting of the components to adjacent card circuitry, and at the same time the positional stability of the card and reduces warpage problems.

In FIGURE 1, it can be seen that each spacer means contain, for example, projecting lugs 24, one near each end of the card spacer 10, for example, whereby a puller means (not shown) can be removably attached to accommodate removal of the spacer 10 along with the cards 14 for whatever purpose required. The puller may be a U-shaped means of plastic or other suitable material. Although the puller is not specifically described herein, it is obvious that a variety of puller arrangements are utilizable with the projecting lugs 24.

Figure 3:
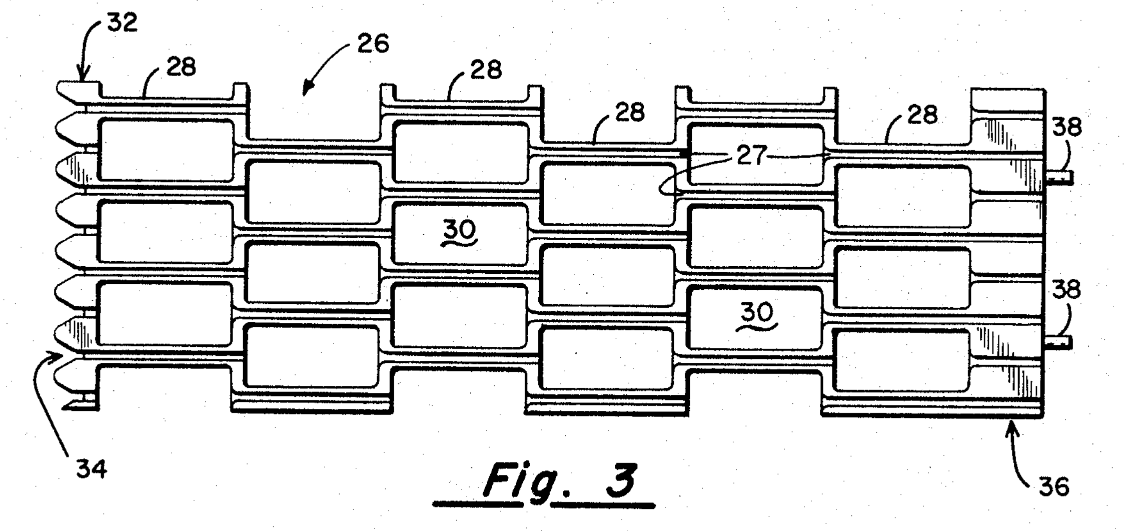
FIGURE 3 is a front view of a card guide means of the present invention.

To this point there has been described a card spacer means 10, cooperating with an edge of the printed circuit card. Cooperating with adjacent edges of the printed circuit card are card guide means 26 as illustrated in FIGURE 3. The card guide 26 is constructed of lightweight and sufficiently strong material such as plastic. However, there is no limitation intended to restrict the material to that of plastic.

The card guide means 26 has a grill-like pattern containing a plurality of walls for forming a plurality of parallel slots or guide grooves 27 for accommodating the edge of the printed circuit card. The grill-like pattern can also be thought of as being represented by a plurality of staggered rows of rectangular-like unsupported areas 30 which can be termed air passages, or the guide can also be thought of as a plurality of adjacent wall portions 28 containing slots that open into the air passages to provide a noncontinuous card slot arrangement. At one end 32 of the card guide, the slots open into a channel 34 which cooperates with a retaining bar (not shown) within the cabinet to hold the card guide in position. At the other end 36 or base of the guide, there are disposed, integral with the guide, projections 38 adapted to cooperate with recesses in the cabinet structure for maintaining the guide in a fixed position.

The particular significance of the card guide is to increase card density because of the greater cooling capability resulting from the additional area available for air passage. More specifically, it is observable from FIGURE 3 that about half of the printed circuit card edge is held or maintained by the guide slots. The remaining unsupported areas permit the passage of larger volumes of air than conventional card guides which consisted of slots running for the entire length of the card. Accordingly, the card guide grill pattern permits air or another suitable cooling means to flow freely through card decks while providing a positive guide for closely spaced cards. The card guide's design permits most of the guide to have open or unsupported areas. Card density can be further increased by the use of thinner printed circuit cards.

Figure 4:
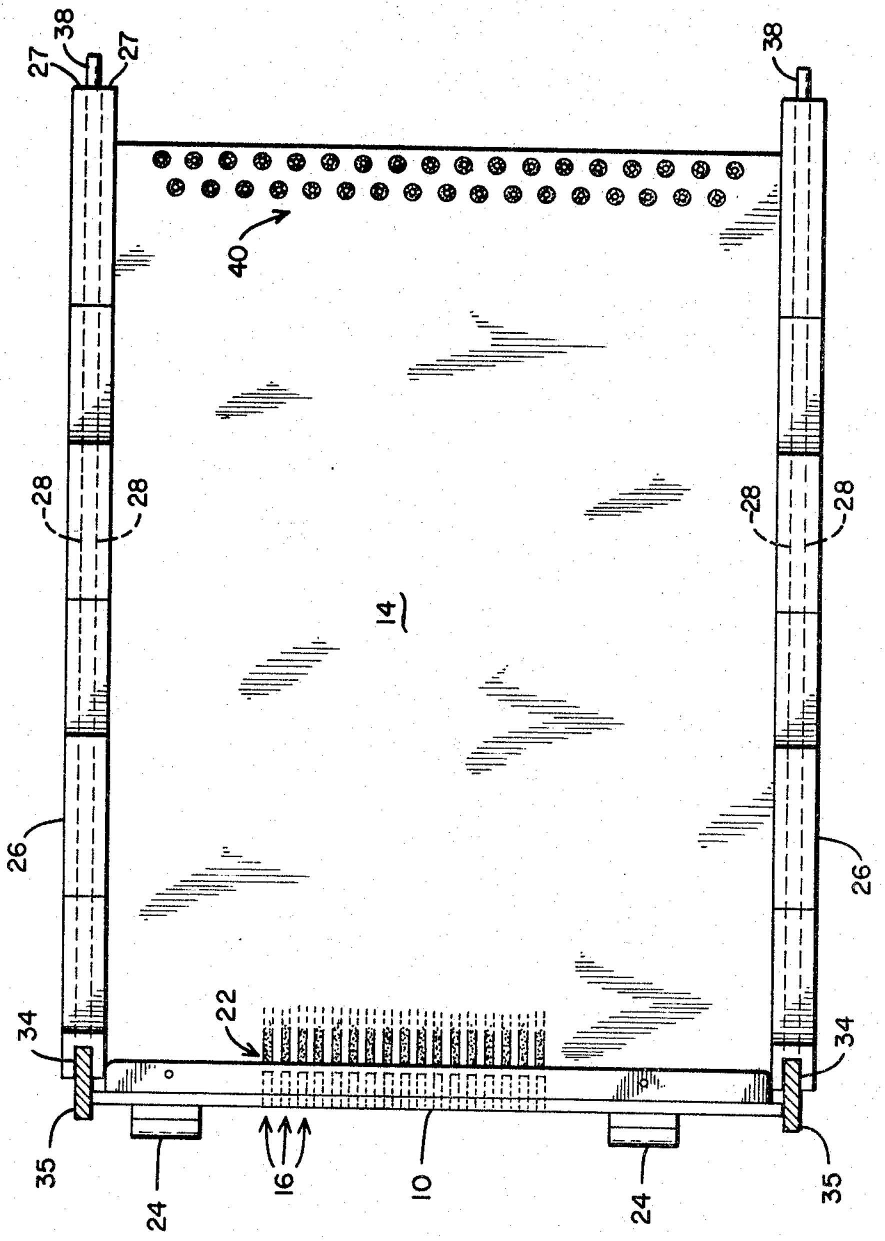
FIGURE 4 is a side view of the present invention showing an assembled condition of the printed circuit card with a card guide and spacer means.

In FIGURE 4 there is shown the entire assembly of the present invention including the guide means 26, spacer means 10, and the printed circuit card 14. Oppositely disposed edges of the card 14 are received in a sliding manner between walls 28 of the card guides 26. It is to be noted that the guides 26 are provided with discontinuous slots 27 on both sides thereof such that a single guide positions a plurality of card edges on both sides. As explained above, the guides are inserted into the cabinet such that the channels 34 are engaged by a retaining bar 35 mounted in the cabinet. The projections 38 engage recesses in the cabinet structure to assure locked positioning of the guides. Terminal rows 40 cooperate with a female connector and male connector means whose terminal posts are in turn wire wrapped to a back panel.

In using the present invention, therefore, to change logic cards the operator engages a puller to the lugs of the spacer and disengages the printed circuit card and female connector from its male connector by applying a removing force. To substitute another card, the old card is merely withdrawn along the slides and another inserted.

To perform a circuit check of the logic cards instead, the operator merely inserts a test probe means into the apertures 16 to make electrical contact with the terminals 22 of the printed circuit or logic card 14. While performing the circuit check with the cabinet doors opened, cooling of the system is not interferred with since the spacers remain intact along their sides as described above.

Accordingly, the packaging assembly of the present invention provides a novel combination of features heretofore not achieved in the prior art.

It is therefore, understood that suitable modifications may be made in the apparatus and method as disclosed provided that such modifications come within the spirit and scope of the appended claims. For example, there is no intention to limit the unsupported areas of the card guide to a rectangular configuration. Further, the spacer members may be widened where the components mounted to the card require such additional space. Having now, therefore, fully illustrated and described my invention, what I claim to be new and desire to protect by Letters Patent is set forth in the appended claims.

What is claimed is:

1. In a computer cabinet containing a plurality of electrical circuitry packaging assemblies, the assembly comprising in combination:

(a) a plurality of adjacently disposed elongated spacer members, each including front and rear portions, and first and second sides, said rear portion including an elongated slot for receiving a first terminal edge of a printed circuit card, adjacent ones of said spacer members being in contact along their respective first and second sides;

(b) adjacent ones of said spacer members each containing at least one test access area along said front portion, said access area extending transverse to said first and second sides in contact, and containing an open portion communicating with said elongated slot for permitting electrical contact between a test probe means to be projected through said open portion and said terminal edge on the printed circuit card;

(c) puller lugs integral with each of said spacer members for permitting attachment of a puller means to movably maintain said card; and (d) card guide means including a plurality of parallelly arranged discontinuous card guide members having upper and lower slotted sides, said guide members comprising a plurality of guide segments slotted on said upper and lower sides, said guide segments in combination forming a grill-like pattern having adjacent ones of said segments integrally joined, and each of said guide members adapted for receiving one of a plurality of card edges in associated ones of said slots.

2. The invention of claim 1 wherein said spacer member and associated card are removed in a sliding manner from the card guide.

3. A printed circuit card spacer device for use in an electrical circuit packaging assembly for mounting printed circuit cards in spaced relationship to one another, the spacer device comprising: a body member of predetermined length and width, said body member including a front portion having a front surface and a rear surface, a pair of edge surfaces disposed at the extremities of said front portion along said length and intermediate said front and rear surfaces for slidably engaging similar edges of adjacent spacer members for forming a portion of an enclosure rearward from said rear surface, and said front portion having at least one aperture therethrough for receiving a test probe; first and second wall-members parallelly disposed along said length and integrally formed with said rear surface and at either side of said aperture, said rear surface and said first and second wall-members in combination forming an elongated slot for receiving a terminal edge of a printed circuit card.

4. A spacer device as in claim 3 and further including test probe limiting means rearward from said rear surface and cooperating with one of said wall-members for limiting the movement of a test probe inserted in said aperture to a terminal portion of the printed circuit card.

5. A spacer as in claim 4 and further including puller means integral with said front surface for permitting removal of the spacer device.

6. A printed circuit card spacer device for use in an electrical circuit packaging assembly for mounting spaced printed circuit cards, the spacer device comprising: a body member of predetermined length and width, said body member including a front portion having a front surface and a rear surface, a pair of edge surfaces disposed at the extremities of said front portion along said length and intermediate said front and rear surfaces for slidably engaging similar edges of adjacent spacer members for forming a portion of an enclosure rearward from said rear surface, said front portion having at least one aperture therethrough for receiving a test probe; a first wall-member disposed along said length on said rear surface and integrally joined therewith at one side of said aperture, the portion of said rear surface intermediate said one side of said aperture and the juncture of said first wall-member and said rear surface operating at least in part to locate a printed circuit card in a predetermined relationship with said aperture such that test probes inserted through said aperture can impinge on a terminal portion of the printed circuit card; and a second wall-member of a predetermined height dimension perpendicular to said rear surface and a thickness dimension, said second wall-member disposed parallel with said first wall-member and integrally joined to said rear surface, said second wall-member at least in part superimposed in its thickness dimension over a portion of said aperture, said second wall-member including a channel coincident in cross-section to said superimposed portion of said aperture and extending a predetermined distance into said height dimension of said second wall-member, the rearward extremity of said channel limiting the depth to which a test probe can be inserted to the terminal portion of the associated printed circuit card, said rear surface and said first and second wall-members forming an elongated slot for receiving and positioning the terminal portion of the associated printed circuit card, said slot having a depth defined by said height dimension of said second wall-member and a width substantially that of the thickness of the printed circuit card to be received therein.

7. A spacer device as in claim 6 wherein said body member includes a plurality of apertures therethrough along said length and opening into said elongated slot.

8. A printed circuit card guide comprising: a body portion having a forward and a rearward end, said forward and rearward ends adapted for mounting in a support structure, said body portion including a plurality of parallelly disposed channels for receiving and retaining associated ones of a plurality of edges of printed circuit cards, each of said channels having a plurality of segments separated by discontinuous portions, said plurality of segments for each of said channels aligned and extending from said forward end to said rearward end, plurality of segments for adjacent ones of said channels arranged in an offset relationship to said plurality of segments on either side thereof and said adjacent channels integrally formed at the extremities of the respective ones of said plurality of segments, thereby forming a grill-like pattern of discontinuous channels for permitting flow of coolant through said discontinuous portions while maintaining a plurality of associated printed circuit cards in an aligned relationship.

9. A printed circuit card guide as in claim 8 wherein said forward end includes a retaining channel having upper and lower retaining means extending transverse to said plurality of parallelly disposed channels, said retaining channels adapted for receiving a retaining bar for retaining said printed circuit card guide in a support structure, at least one of said upper and lower retaining means comprised of a plurality of rounded protrusion members forwardly extending from said forward end, each of said rounded protrusion members positioned intermediate an associated pair of adjacent ones of said parallelly disposed channels, adjacent pairs of said rounded protrusion members cooperating to position an edge of a printed circuit card into the one of said channels intermediate said pair of rounded protrusion members as the printed circuit card is inserted along said one of said channels.

10. A printed circuit card guide as in claim 9 wherein each of said plurality of channel segments includes printed circuit card positioning means at the forward extremity thereof for facilitating insertion of the edge of a printed circuit card.

11. A printed circuit card guide as in claim 8 wherein said body portion includes upper and lower portions, said upper portion including said plurality of discontinuous channels, and said lower portion including a like plurality of said discontinuous channels, said upper portion adapted to cooperate with a first group of printed circuit cards and said lower portion adapted to cooperate with a second group of printed circuit cards.

12. An electronic circuit packaging assembly including in combination a plurality of printed circuit cards, each of said cards including first, second, third, and fourth edges, first and second sides, and at least one of said cards including at least one test terminal located on said first side adjacent to said first edge; a plurality of spacer means, each of said spacer means including a body member of predetermined length and width, said body member including a front portion having a front surface and a rear surface, a pair of edge surfaces disposed at the extremities of said front portion along said length and intermediate said front and rear surfaces for slidably engaging similar edges of adjacent ones of said spacer means for forming a portion of an enclosure rearward from said rear surface, and said front portion having at least one aperture therethrough for receiving a test probe, and first and second wall-members parallelly disposed along said length and integrally formed on said rear surface and at opposite sides of said aperture, said rear surface and said first and second wall-members forming an elongated slot for receiving said first edge of an associated one of said plurality of printed circuit cards, said aperture being in cooperative relation with said test terminal; and first and second printed circuit card guide means each including a body portion having a forward end and a rearward end, said forward and rearward ends adapted for mounting in a support structure, said body portion of said first printed circuit guide means including a plurality of parallelly disposed channels for slidably receiving and supporting associated ones of said second edges of said printed circuit cards and said body portion of said second printed circuit card guide means including a plurality of parallelly disposed channels for slidably receiving and supporting said third edges of associated ones of said printed circuit cards, each of said channels having a plurality of segments separated by discontinuous portions, said plurality of segments for each of said channels aligned and extending from said forward ends to said rearward ends, adjacent ones of said channels arranged with said plurality of segments in an offset relationship to said plurality of segments on either side thereof and said adjacent channels integrally formed at the extremities of the respective ones of said plurality of segments, thereby forming a grill-like pattern of discontinuous channels for permitting flow of coolant through said discontinuous portions behind said rear surface of said plurality of spacer members while maintaining a plurality of associate ones of said printed circuit cards in a supported aligned relationship.

13. An assembly as in claim 12 wherein each of said spacer means further include test tube probe limiting means rearward from said rear surface and cooperating with one of said wall-members for limiting the movement of said test probe inserted in said aperture to said test terminal of said printed circuit card.

14. An assembly as in claim 13 wherein each of said printed circuit card guide means includes a retaining channel having upper and lower retaining means transversely arranged with respect to said parallelly disposed channels, said retaining channel adapted for receiving a retaining bar for retaining said printed circuit card guide means in a support structure, at least one of said upper and lower retaining means comprised of a plurality of rounded protrusion members forwardly extending from said forward end, each of said protrusion members positioned intermediate an associated pair of said adjacent channels, adjacent pairs of said protrusion members cooperating to position an associated one of said second or third edges on said printed circuit card into the one of said channels intermediate said pair of protrusion members as the associated one of said printed circuit cards is inserted along said one of said channels.

15. An assembly as in claim 14 wherein said body portion of said printed circuit card guide means includes upper and lower portions, said upper portion including said plurality of discontinuous channels, and said lower portion including a like plurality of said discontinuous channels, said upper portion adapted to cooperate with said plurality of printed circuit cards and said lower portion adapted to cooperate with another plurality of printed circuit cards.

References Cited by the Examiner

UNITED STATES PATENTS

| | | | |
|---|---|---|---|
| 1,962,584 | 6/1934 | Davies | 174—68.5 |
| 2,832,942 | 4/1958 | French | 339—176 |
| 2,843,806 | 7/1958 | O'Neill | 317—100 |
| 3,075,167 | 1/1963 | Kinkaid | 339—176 |
| 3,177,404 | 4/1965 | Patmore | 317—99 |
| 3,198,991 | 8/1965 | Barnett | 317—100 |
| 3,231,785 | 1/1966 | Calabro | 317—100 |

ROBERT K. SCHAEFER, *Primary Examiner.*

M. GINSBURG, *Assistant Examiner.*